(12) United States Patent
Morikawa

(10) Patent No.: US 6,177,821 B1
(45) Date of Patent: Jan. 23, 2001

(54) MICROCOMPUTER WITH FREQUENCY MULTIPLICATION CIRCUIT

(75) Inventor: Takafumi Morikawa, Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/404,470

(22) Filed: Sep. 24, 1999

(30) Foreign Application Priority Data

Apr. 19, 1999 (JP) .................................................. 11-111336

(51) Int. Cl.[7] ...................................................... H03L 7/00
(52) U.S. Cl. ............................................. 327/160; 327/20
(58) Field of Search ............................. 327/18, 20, 141, 327/142, 143, 145, 147, 151, 160

(56) References Cited

U.S. PATENT DOCUMENTS 5,945,856 * 8/1999 Yanagiuchi ........................... 327/159
5,963,068 * 10/1999 Hardesty ............................... 327/156

FOREIGN PATENT DOCUMENTS

60/217779   10/1985   (JP) .
6/252750    9/1994    (JP) .

* cited by examiner

Primary Examiner—Jeffrey Zweizig
(74) Attorney, Agent, or Firm—Burns, Doane, Swecker & Mathis, LLP

(57) ABSTRACT

In the microcomputer with a PLL (1007), a frequency lock signal generation circuit (101) inputs a XINFAST signal (1025) and a PLLFAST signal (1026) of a L level transferred from the PLL (1007) while frequency oscillation of the PLL (1007) is in unstable state, and then outputs a lock signal (110) to indicate refreshing of counting down to a stable detection timer (107).

6 Claims, 13 Drawing Sheets

MICROCOMPUTER WITH FREQUENCY MULTIPLICATION CIRCUIT

BACKGROUND OF THE INVENTION

1. Field of the Invention

The present invention relates to a microcomputer with a frequency multiplication circuit to generate and supply a clock signal of a desired frequency obtained by multiplying a clock signal of a predetermined frequency supplied from an external device.

2. Description of the Related Art

FIG. 1 is a block diagram showing a configuration of a conventional microcomputer with a frequency multiplication circuit. In FIG. 1, the reference number 1000 designates the microcomputer, 1002 denotes a central processing unit (hereinafter referred to as CPU), and 1003 indicates a ROM in which a program to execute the microcomputer 1000 and data are stored. The reference number 1004 designates a RAM to temporarily store data. Further, the reference number 1005 denotes a peripheral circuit such as a timer, and 1006 indicates an interrupt circuit for processing interrupt requests transferred from the peripheral circuit 1005 and other circuits. The reference number 1007 designates a Phase Locked Loop (PLL) as a frequency multiplication circuit for generating a clock signal of a frequency obtained by multiplying a clock signal 1012 supplied through an external terminal 1010. The reference number 1008 denotes a clock generation circuit for generating a standard clock signal to be used for operating a microcomputer based on the XIN signal 1012 supplied through the external 1010 and the clock signal 1013 outputted from the frequency multiplication circuit 1007. The reference number 1009 denotes an interface circuit through which data and addresses are transferred between the microcomputer 1000 and external devices. The reference number 1011 designates internal address buses and internal data buses in the microcomputer 1000. Thus, the conventional microcomputer with the frequency multiplication circuit comprises the circuit elements 1002 to 1011 and operates based on the various control signals 1012 to 1015 described above.

Next, a description will be given of the operation of the conventional microcomputer with the frequency multiplication circuit.

The frequency multiplication circuit 1007 incorporated in the microcomputer 1000 shown in FIG. 1 is a circuit as a phase locked loop type. Hereinafter the frequency multiplication circuit 1007 will be referred to as the PLL.

Firstly, the configuration and operation of the PLL 1007 incorporated in the conventional microcomputer 1000 will be explained.

FIG. 2 is a block diagram showing a configuration of the PLL 1007. In FIG. 2, the reference number 1016 designates a phase frequency comparison device (PFD) for comparing the phases of the frequencies of two kinds of input signals, the XIN input signal and the clock signal CLK oscillated in the PLL 1007. The reference number 1017 denotes a charge pump (CP), 1018 indicates a voltage control oscillator (VCO) for changing the frequency oscillated based on a VCONT input voltage 1028 transferred from the charge pump 1017. The voltage control oscillator 1018 generates a high frequency when the VCONT input voltage 1028 is high and a low frequency when it is low. The reference number 1019 designates a division circuit for dividing the clock signal outputted from the VCO 1018 by a desired multiplication rate. For example, the frequency of the clock signal is divided by two when the desired multiplication rate is two, and the frequency of the clock signal is divided by three when the desired multiplication rate is three. The reference number 1020 designates a resistance, and 1021 denotes a capacitor. A low pass filter comprises the resistance 1020 and the capacitor 1021.

Next, the operation of the PLL 1007 will be explained when the multiplication rate is two.

When the power switch of the microcomputer 1000 shown in FIG. 1 enters ON, the microcomputer 1000 inputs the XIN input signal. In this situation, the VCO 1018 in the PLL 1007 shown in FIG. 2 initiates the oscillation of the frequency with a constant frequency. The clock signal 1023 generated by and outputted from the VCO 1018 is divided by two by the division circuit 1019. The divided clock signal 1024 is outputted from the division circuit 1019 to the PFD 1016. Thereby, the PFD 1016 compares a rising time of the XIN input signal 1012 with a rising time of the clock signal 1024.

In a case that there is a phase difference of the rising time between them shown in FIG. 3, that is to say, when the rising time of the XIN input signal 1012 is faster than that of the clock signal 1024 (Timing T121), the PFD 1016 judges that the frequency of the clock signal 1024 is delayed from the XIN input signal 1012 and changes the level of the XINFAST signal 1025 from a high level (H level) to a low level (L level) at the rising time (Timing T121) of the XIN input signal 1012.

After this, the level of the XINFAST signal 1025 is changed from the L level to the H level when the PFD 1016 inputs the rising edge of the clock signal 1024 (Timing T122). The PFD 1016 then outputs to the charge pump (CP) 1017 the phase difference between the rising edge of the XIN input signal 1012 and the rising edge of the clock signal 1024 as the XINFAST signal 1025 of a low pulse (L pulse). During the above operation, the level of the PLLFAST signal 1026 keeps the H level.

During the input of the XINFAST signal 1025 of the L pulse, the CP 1017 outputs the data of the H level. Thereby, the capacitor 1021 in the low pass filter 1022 is charged and voltage potential of the VCONT voltage 1028 is increased by the electric charge. This operation increases the frequency of the clock signal 1023 oscillated by and outputted from the VCO 1018.

On the contrary, as shown in FIG. 4, when the rising time of the clock signal 1024 is faster than that of the XIN input signal 1012 (Timing T131), the PFD 1016 judges that the frequency of the clock signal 1024 is faster than the frequency of the XIN input signal 1012, and changes the level of the PLLFAST signal 1026 from the H level to the L level at the rising time (Timing T131) of the clock signal 1024.

After this, the level of the PLLFAST signal 1026 is changed from the L level to the H level when the PFD 1016 inputs the rising edge of the XIN input signal 1012 (Timing T132). The PFD 1016 then outputs to the charge pump (CP) 1017 the phase difference between the rising edge of the clock signal 1024 and the rising edge of the XIN input signal 1012 as the PLLFAST signal 1026 of a low pulse (L pulse). During the above operation, the level of the XINFAST signal 1025 keeps the H level. During the input of the PLLFAST signal 1026 of the L pulse, the CP 1017 outputs the data of the L level. Thereby, the capacitor 1021 in the low pass filter 1022 is discharged and voltage potential of the VCONT voltage 1028 is decreased by the electric charge. This operation decreases the frequency of the clock signal 1023 oscillated by and outputted from the VCO 1018.

By repeating those two operations described above, when the rising edges of the XIN input signal 1012 and the clock signal 1024, that is to say, both frequencies become a same value, as shown in FIG. 5, the XINFAST signal 1025 and the PLLFAST signal 1026 keep the H level. Thereby, the VCO 1018 may output the clock signal 1023 of a constant voltage by the low pass filter 1022 when both rising edges of them become same. That is to say, the VCO 1018 outputs the clock signal having the stable frequency multiplied by two.

Because the conventional microcomputer with the frequency multiplication circuit has the configuration described above, it takes a long time that the PLL 1007 outputs a stable clock signal of a desired frequency after the power of the microcomputer 1000 enters ON and the XIN input signal is then supplied to the PLL 1007. The time required to output the stable clock signal of the desired frequency fluctuates by the change of the voltage of the power source to be used, the change of an environmental temperature, the condition of the input clock signal, and other various factors.

However, in the prior art, the time length required that the PLL may output a stable clock signal of a desired frequency is a fixed time length based on a design evaluation after a microcomputer has been designed, that is to say, based on values having margins for various worth cases. The microcomputer is reset after the above time length is elapsed after the power enters ON and the PLL 1007 then inputs the XIN input signal. Accordingly, it is necessary to wait for the initiation of the releasing operation of the reset state in the microcomputer when the predetermined fixed time length has elapsed. This means that time is necessary to initiate the releasing operation from the reset state in the microcomputer although the PLL may output the clock signal of a stable frequency before the fixed time length is elapsed. Thus, the conventional microcomputer with the frequency multiplication circuit has a low efficiency.

SUMMARY OF THE INVENTION

Accordingly, an object of the present invention is, with due consideration to the drawbacks of the conventional technique, to provide a microcomputer with a frequency multiplication circuit capable of executing a releasing operation of the reset state in the microcomputer and capable of initiating the output of a clock signal of a stable frequency as a system clock to various circuits in the microcomputer by detecting the stable state of frequency oscillation by the frequency multiplication circuit as a PLL. The stable state of frequency oscillation may be detected in the microcomputer of the present invention.

In accordance with a preferred embodiment of the present invention, a microcomputer with a frequency multiplication circuit comprises a frequency multiplication circuit, control means, a stable detection timer, and a register. The frequency multiplication circuit multiplies an input signal and outputs the multiplied input signal as a clock signal and generates and outputs a first control signal indicating a phase difference between the input signal and the clock signal. The control means generates and outputs a second control signal of a first level when the first control signal indicates that the frequency oscillation operation of the frequency multiplication circuit is in an unstable state, and generates and outputs the second control signal of a second level when the first control signal indicates that the frequency oscillation operation of the frequency multiplication circuit is in a stable state. The stable detection timer performs a counting down operation by receiving the input signal and refreshes the counting down operation when receiving the second control signal of the first level outputted from the control means. The register stores a value based on a third control signal generated by and transferred from the stable detection timer when there is an overflow in the stable detection timer. The microcomputer initiates operation based on the value stored in the register.

In the microcomputer with the frequency multiplication circuit as another preferred embodiment according to the present invention, the frequency multiplication circuit outputs a XINFAST signal of the first level as the first control signal indicating that a rising edge of the input signal is faster in phase than a rising edge of the clock signal. In addition, the frequency multiplication circuit also outputs a PLLFAST signal of the first level as the first control signal indicating that a rising edge of the clock signal is faster in phase than a rising edge of the input signal. Further, the frequency multiplication circuit also outputs the XINFAST signal of the second level and the PLLFAST signal of the second level as the first control signal when the frequency oscillation operation of the frequency multiplication circuit is in the stable state. In the microcomputer above, the control means comprises a delay circuit for inputting the XINFAST signal and the PLLFAST signal outputted from the frequency multiplication circuit and for delaying each of the XINFAST signal and the PLLFAST signal by a predetermined time length, a first NOR circuit for performing a NOR arithmetic operation between the XINFAST signal and delayed XINFAST signal from the delay circuit, a second NOR circuit for performing a NOR arithmetic operation between the PLLFAST signal and delayed PLLFAST signal from the delay circuit, and a third NOR circuit for performing a NOR arithmetic operation between outputs from the first NOR circuit and the second NOR circuit.

In the microcomputer with the frequency multiplication circuit as another preferred embodiment according to the present invention, the microcomputer further comprises a shift register having a plurality of registers in a plurality of stages. In the microcomputer, the register in the lowest stage stores a first value when receiving the second control signal of the second level outputted from the control means, and then, the first value is shifted to the plurality of registers in order when the shift register continuously receives the second control signal of the second level from the control means. In addition, a second value is set to all of the plurality of registers in the shift register when the shift register receives the second control signal of the first level outputted from the control means. Further, an external device recognizes the operation state of the frequency multiplication circuit based on the value stored in the register as the uppermost stage in the shift register.

In the microcomputer with the frequency multiplication circuit as another preferred embodiment according to the present invention, the first level is a Low level and the second level is a High level.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 6:
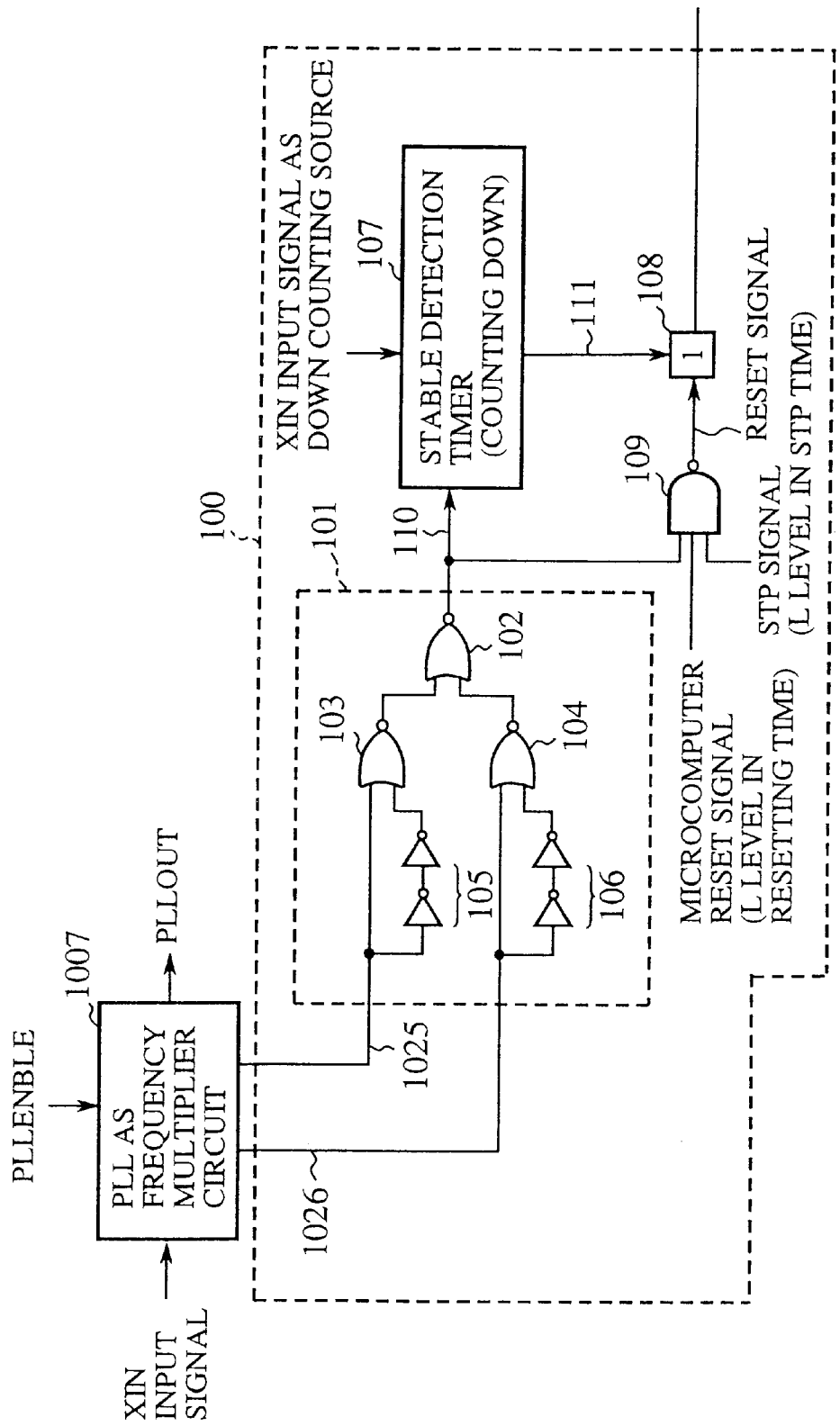
FIG. 6 is a block diagram showing a configuration of a PLL as a frequency multiplication circuit and a peripheral circuit incorporated in a microcomputer according to the first embodiment of the present invention.
Figure 7:
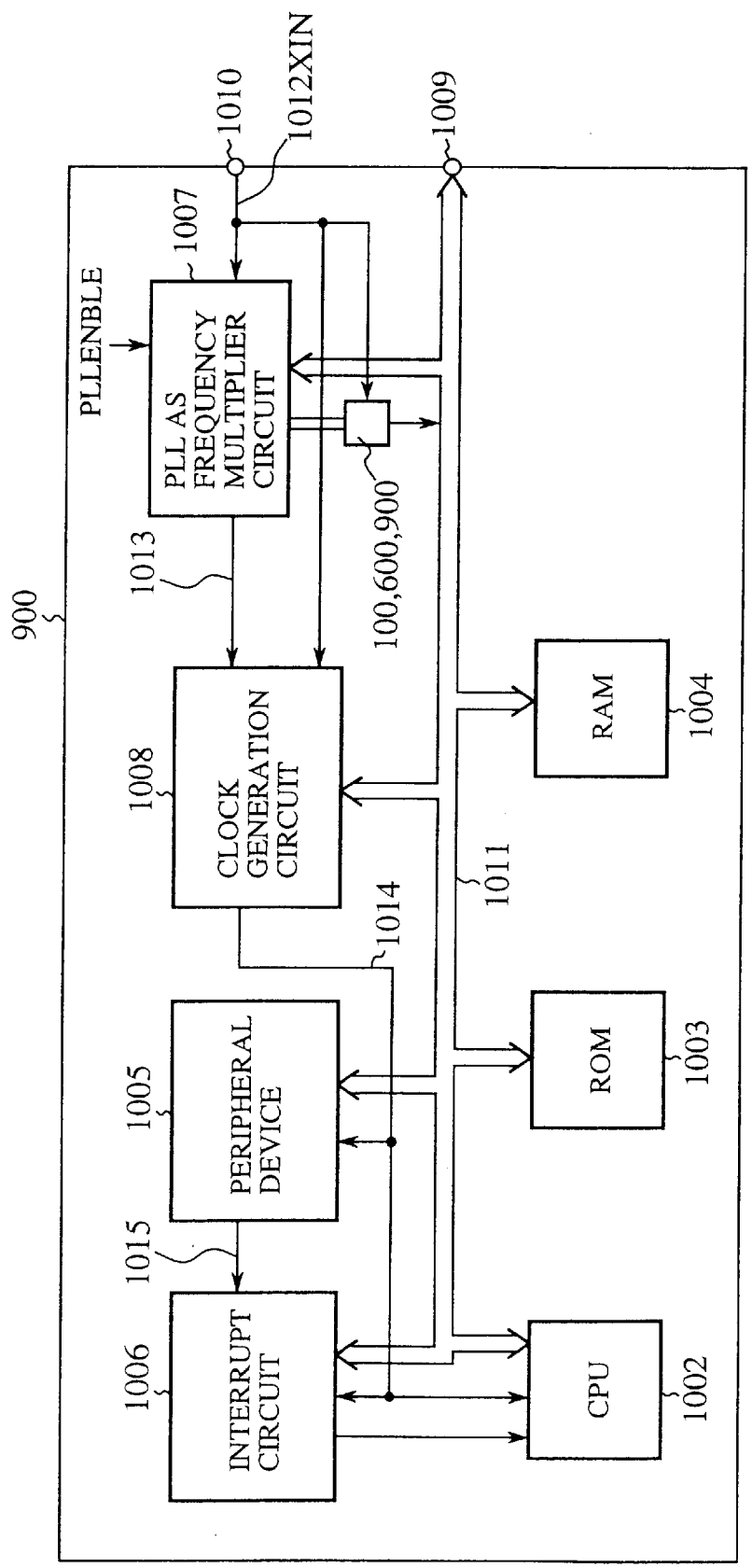
FIG. 7 is a block diagram showing an entire configuration of the microcomputer with the PLL and the peripheral circuit according to the present invention.

FIG. 6 is a block diagram showing a configuration of a PLL as a frequency multiplication circuit and a peripheral circuit 100 incorporated in a microcomputer according to the first embodiment of the present invention. FIG. 7 is a block diagram showing the entire configuration of the microcomputer with the PLL and the peripheral circuit according to the present invention. In FIG. 7, the reference number 1007 designates the frequency multiplication circuit (hereinafter referred to as the PLL) and 900 denotes the microcomputer of the present invention.

In FIG. 6 showing the PLL 1007 and the peripheral circuit 100, the reference number 101 designates a frequency lock signal generation circuit comprising a NOR circuit 102, a NOR circuit 103, a NOR circuit 104, and delay circuits 105 and 106 each made up of a plurality of inverters.

Other circuit elements in the microcomputer 900 according to the present invention are the same of those circuit elements and the same reference numbers will be used for those same circuit elements.

Each of the delay circuits 105 and 106 in the frequency lock signal generation circuit 101 eliminates a sharp Low pulse, like a beard shape, generated in the XINFAST signal 1025 and the PLLFAST signal 1026 by a phase difference between rising edges of the XIN input signal 1012 and the clock signal (CLK) 1024 even if the PLL 1007 is in a stable state in which the PLL 1007 stability oscillates a clock signal of a desired frequency.

The reference number 107 designates a stable detection timer for performing a counting down of the XIN input signal as a count source and for performing a refreshing operation based on the lock signal 110 outputted from the frequency lock signal generation circuit 101. The reference number 108 denotes a PLL stable detection register for storing a value indicating the state of frequency oscillation by the PLL 1007. An external device (not shown) can check whether or not the state of the frequency oscillation of the PLL 1007 is stable by monitoring the value stored in the register 108. The reference number 109 indicates a NAND circuit.

Next, a description will be given of the operation of the microcomputer 900 with the PLL 1007 and the peripheral circuit 100 as shown in FIG. 6 and FIG. 7.

Figure 8:
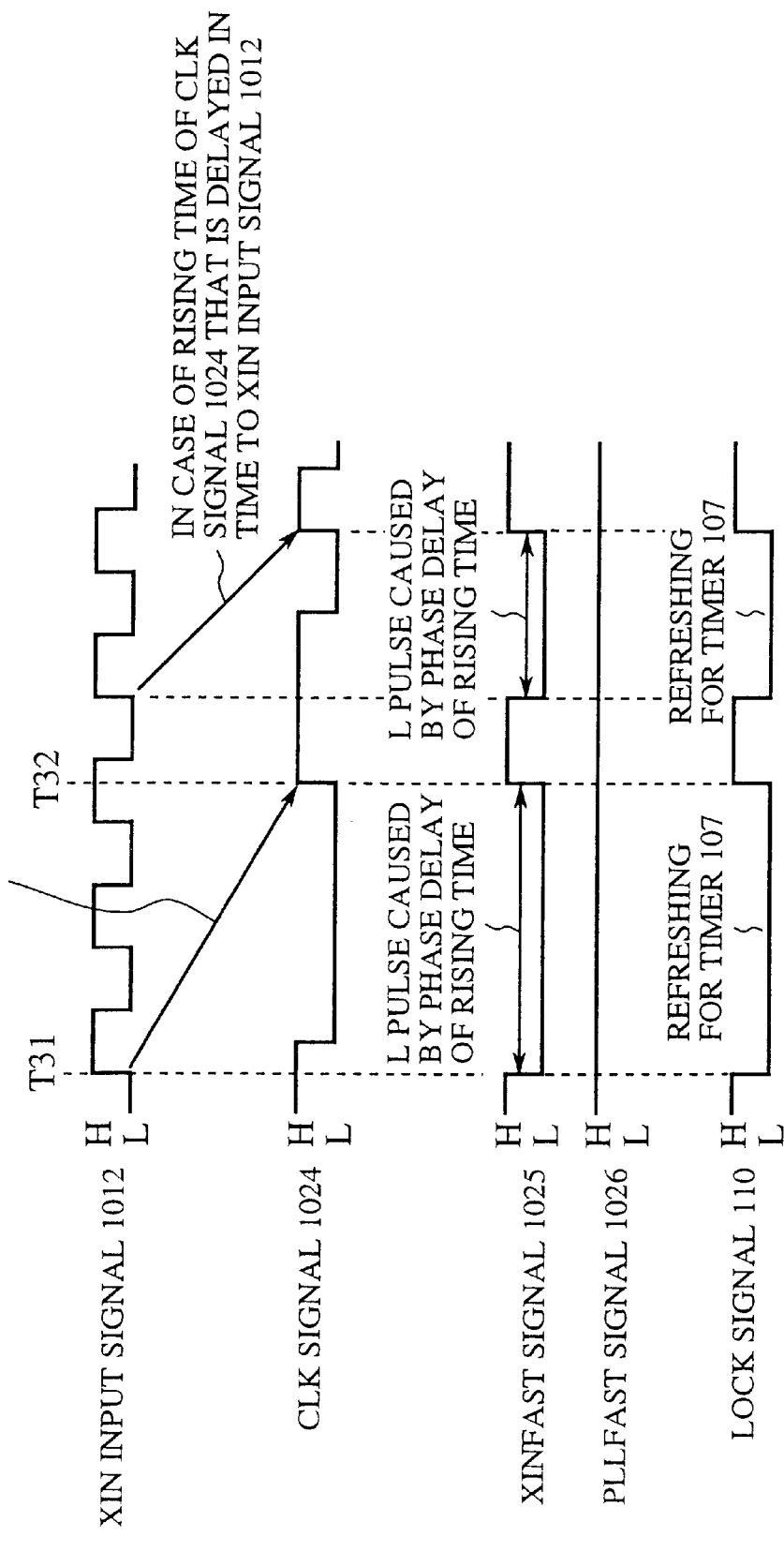
FIG. 8 is a timing chart showing the operation of the microcomputer with the PLL as the first embodiment.
Figure 9:
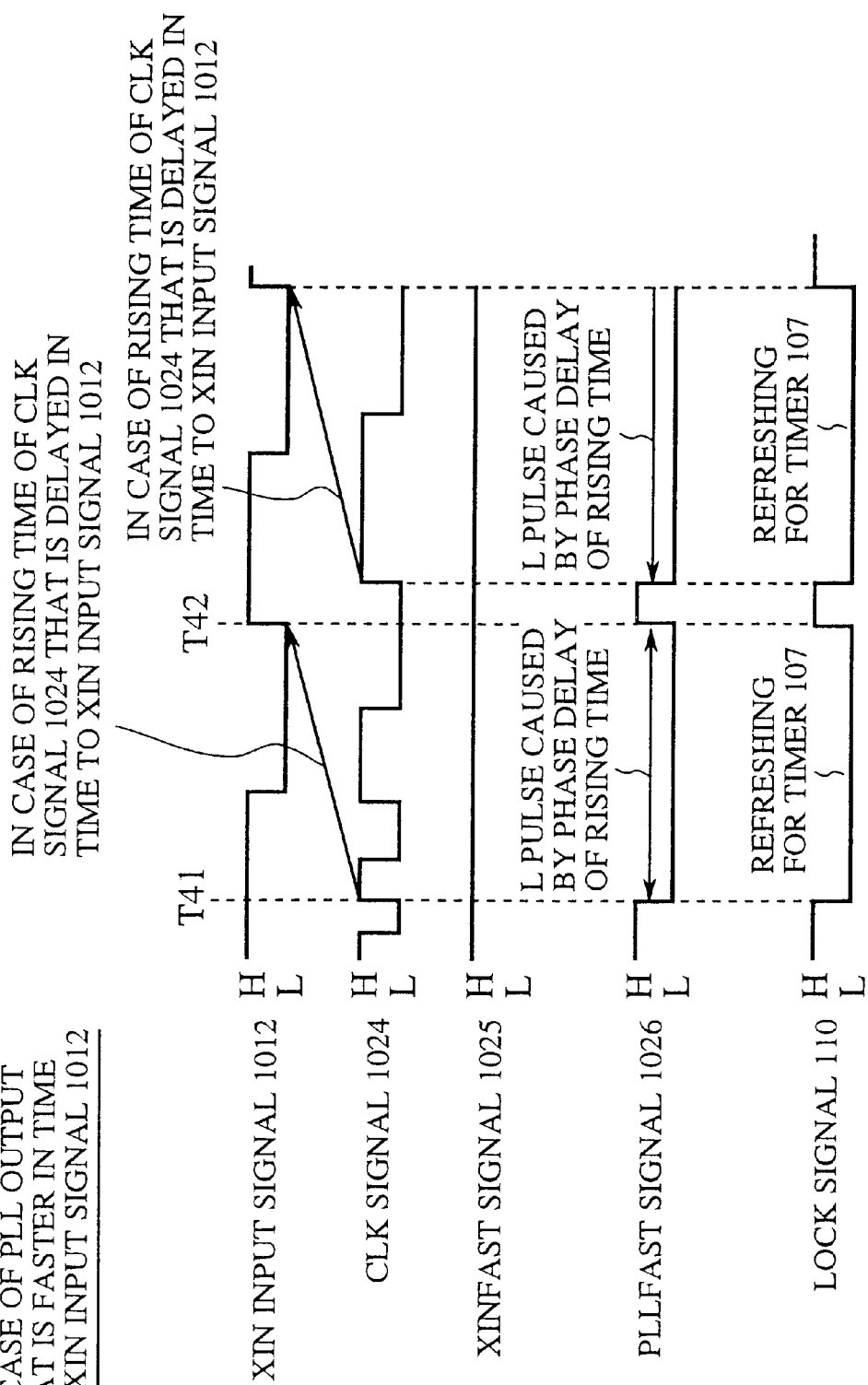
FIG. 9 is a timing chart showing the operation of the microcomputer with the PLL as the first embodiment.
Figure 10:
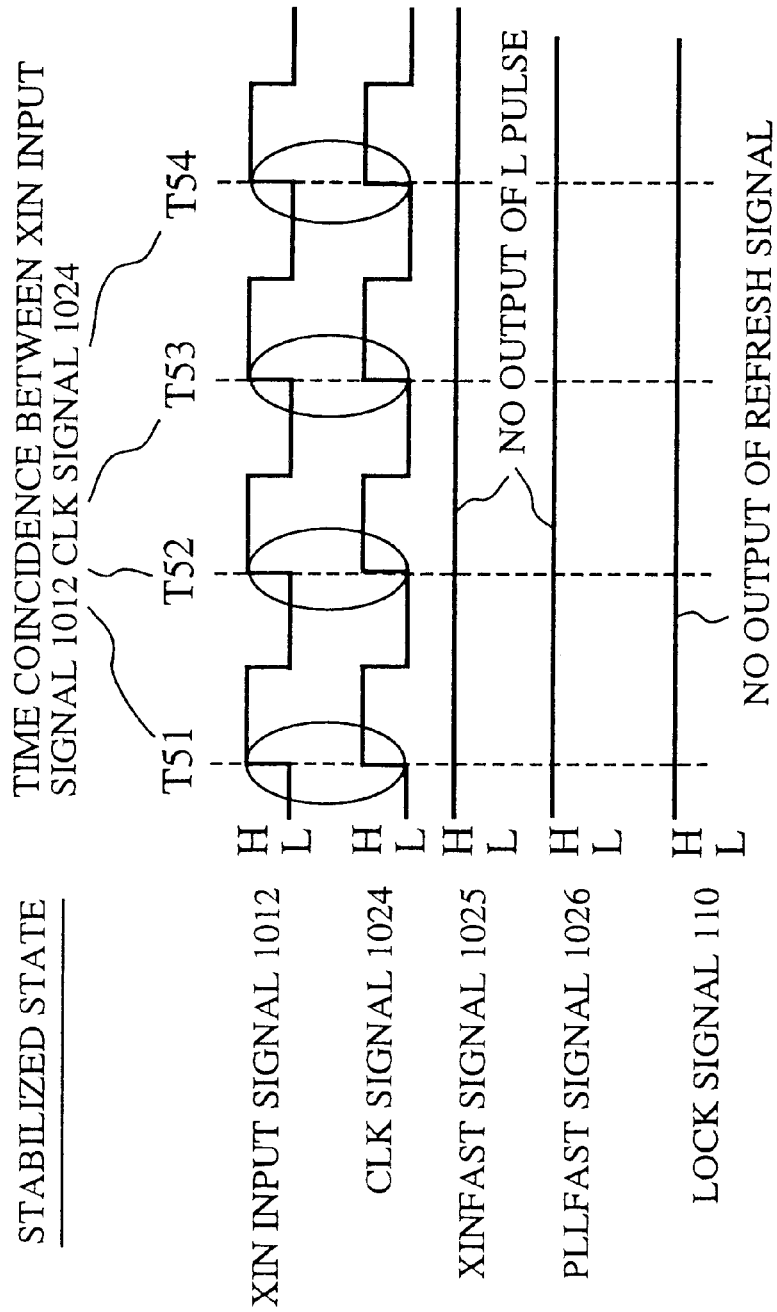
FIG. 10 is a timing chart showing the operation of the microcomputer with the PLL as the first embodiment.

FIGS. 8 to 10 are timing charts showing the operation of the microcomputer 900 with the PLL 1007 and the peripheral circuit 100 as the first embodiment of the present invention.

Figure 1:
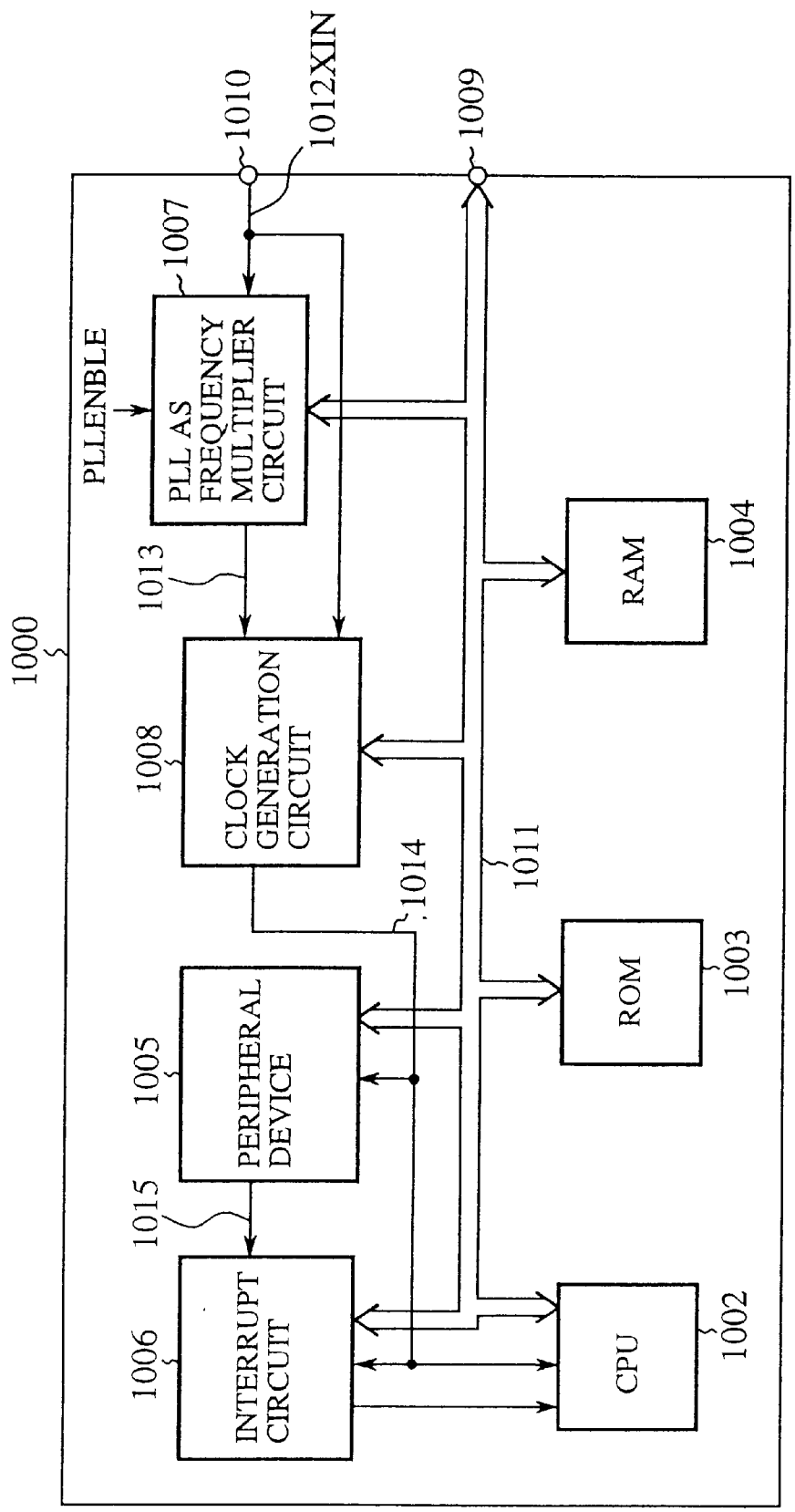
FIG. 1 is a block diagram showing a configuration of a conventional microcomputer with a PLL.
Figure 2:
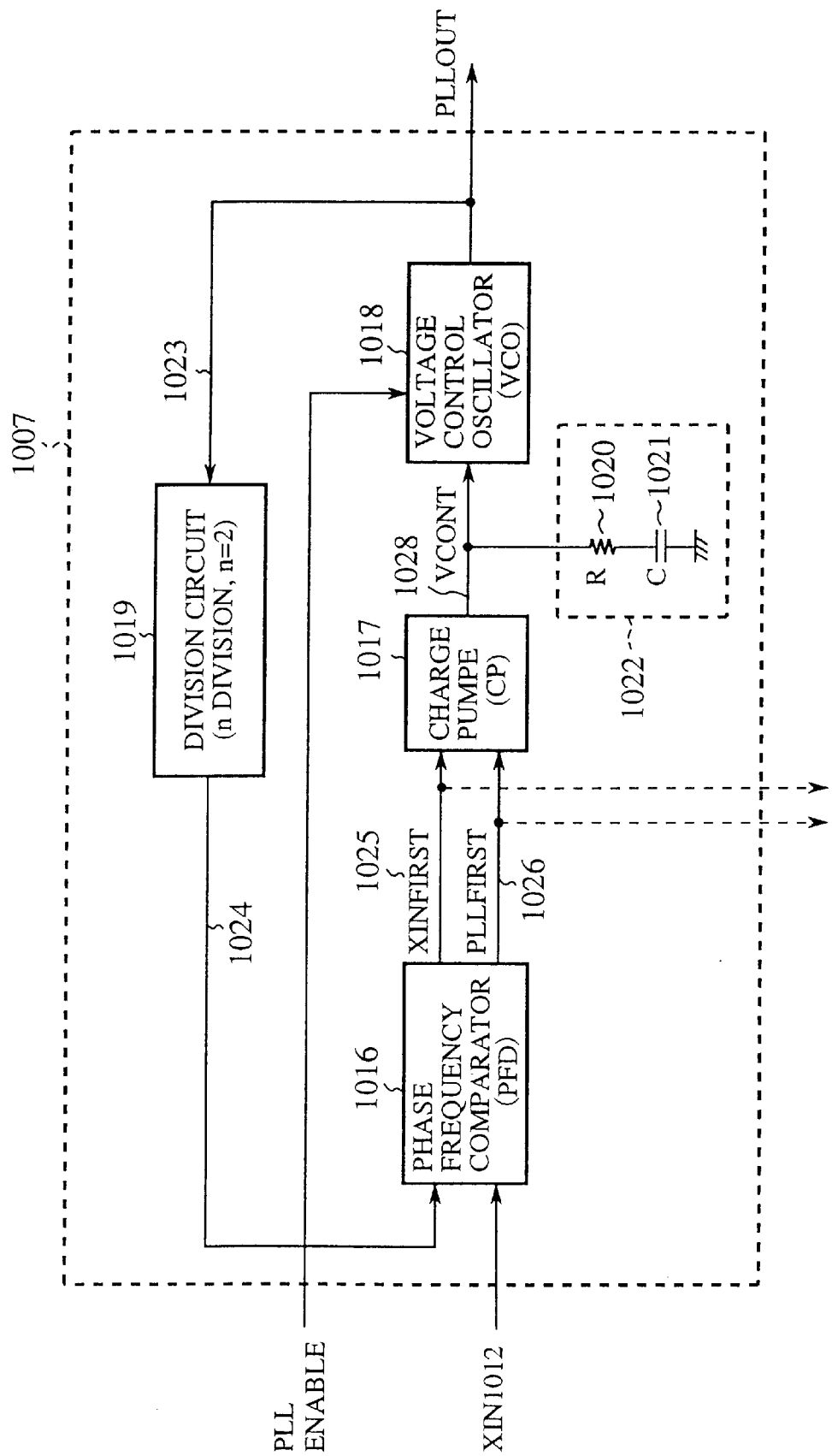
FIG. 2 is a block diagram showing a configuration of the PLL incorporated in each microcomputer shown in FIG. 1 and FIG. 7.
Figure 3:
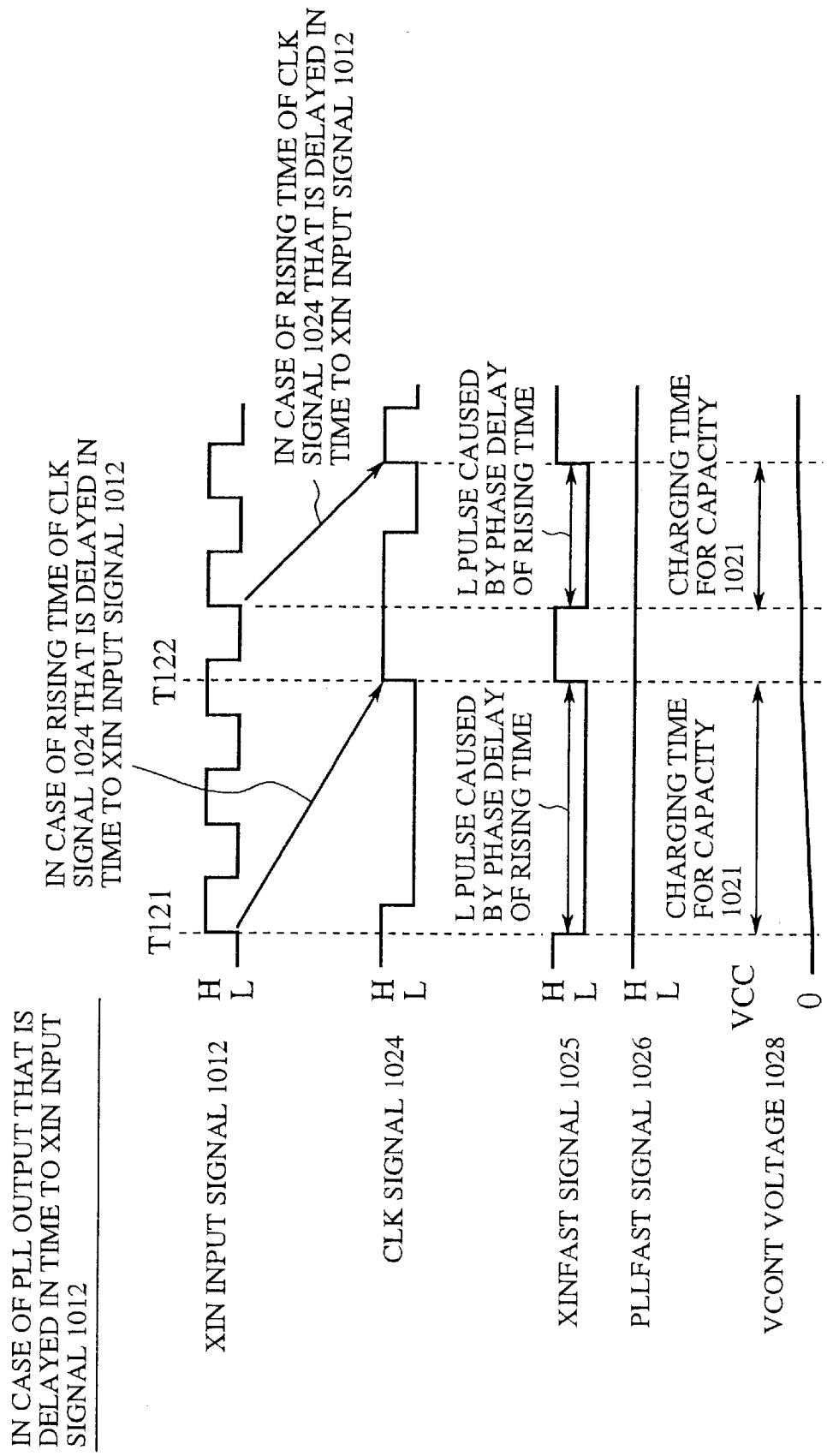
FIG. 3 is a timing chart showing the operation of the PLL incorporated in the conventional microcomputer.
Figure 4:
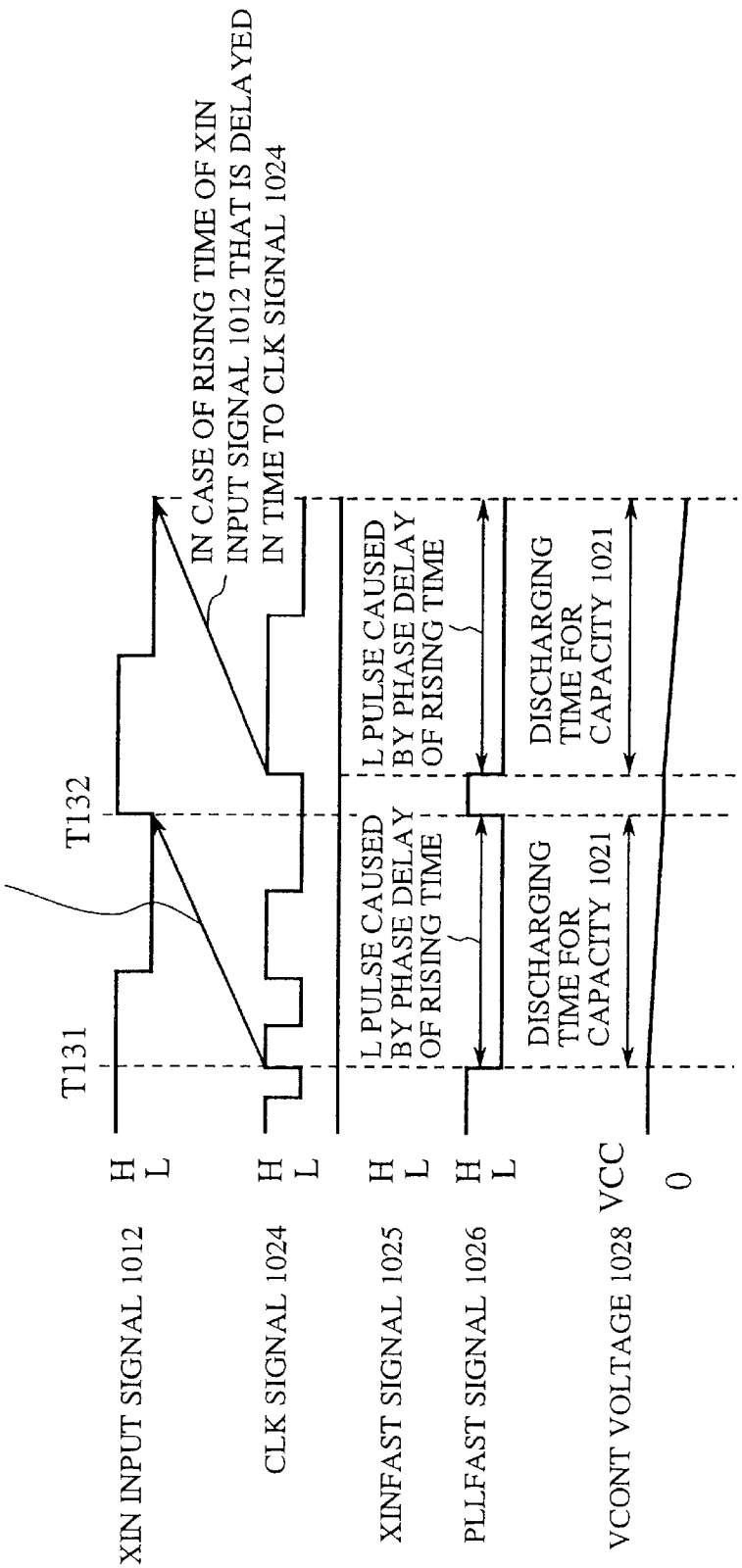
FIG. 4 is a timing chart showing the operation of the PLL incorporated in the conventional microcomputer.
Figure 5:
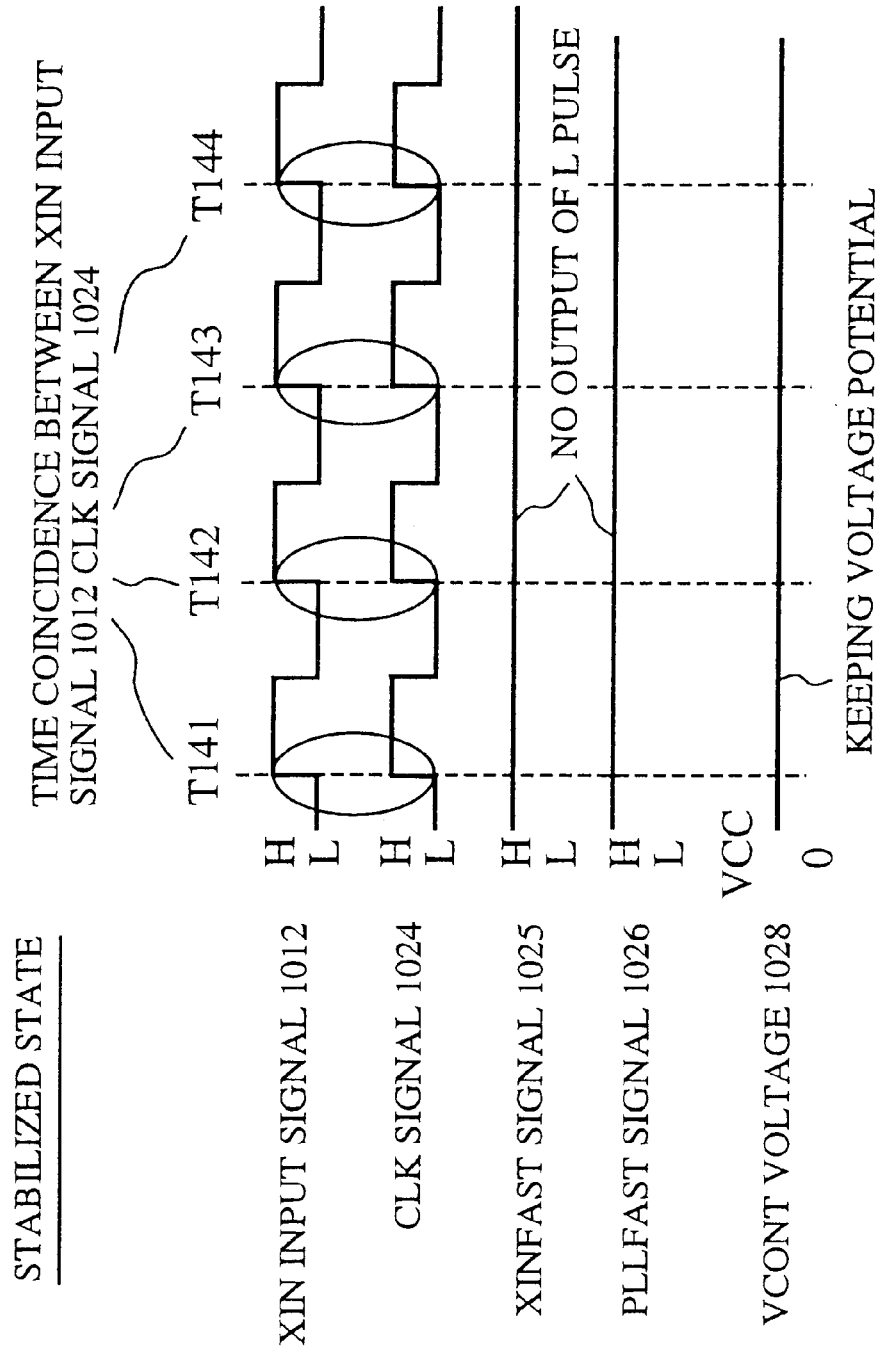
FIG. 5 is a timing chart showing the operation of the PLL incorporated in the conventional microcomputer.

The frequency lock generation circuit 101 in the peripheral circuit 100 shown in FIG. 6 inputs both the XINFAST signal 1025 and the PLLFAST signal 1026 of L level generated by and outputted from the PFD 1016 incorporated in the PLL 1007. Both signals 1025 and 1026 indicate phase difference between the rising edges of the XIN input signal 1012 and the clock signal 1024 of a desired multiplied frequency generated in the PLL 1007, shown in FIG. 2.

For example, when the frequency of the clock signal outputted from the division circuit 1019 does not reach the frequency obtained by multiplying the frequency of the XIN input signal 1012 by two, as shown in FIG. 8, the PFD 1016 generates and outputs pulses of L level as the XINFAST signal 1025 to the frequency lock signal generation circuit 101 in the peripheral circuit 100. The XINFAST signal 1025 indicates the phase difference (for example, the time length from Timing T31 to Timing T32) between the rising edges of the XIN input signal and the clock signal (CK) 1024. Thereby, the frequency lock signal generation circuit 101 outputs a lock signal 110 of a low pulse signal similar to the XINFAST signal 1025.

On the contrary, when the frequency of the clock signal outputted from the division circuit 1019 in the PLL 1007 is more than twice as high as the frequency obtained by multiplying the frequency of the XIN input signal 1012, as shown in FIG. 9, the PFD 1016 generates and outputs a pulse of the L level as the PLLFAST signal 1026 to the frequency lock signal generation circuit 101 in the peripheral circuit 100. The PLLFAST signal 1026 indicates the phase difference (for example, the time length from Timing T41 to Timing T42) between the rising edges of the clock signal 1024 and the XIN input signal 1012, the frequency lock signal generation circuit 101 outputs a lock signal 110 of the low pulse signal similar to the PLLFAST signal 1026.

As described above, the frequency lock signal generation circuit 101 always outputs the L pulse signal during the unstable state (for example, immediately following the enter of the power of the microcomputer and the input of the XIN input signal 1012) of the frequency oscillation by the PLL 1007 based on the above two operations of the frequency lock signal generation circuit 101 by using the XINFAST signal 1025 and the PLLFAST signal 1026 outputted from the PLL 1007.

When the stable detection timer 107 is refreshed by using the L pulse signal (as the lock signal) 110 outputted from the frequency lock signal generation circuit 101 after the power enters ON and then the PLL 1007 inputs the XIN input signal 1012, as the stable detection timer 107 is refreshed, it can continue the counting down operation without causing an underflow. The PLL stable detection register 108 stores the value "0" by resetting.

After this, when the PLL 1007 outputs a stable signal PLLOUT, that is to say, when the frequency oscillation of the PLL 1007 becomes stable, as shown in FIG. 10, both the timings of the rising edges of the XIN input signal 1012 and the clock signal 1024 become equal in time (Timings T51, T52, T53, and T54) and the PLL 1007 outputs the XINFAST signal 1025 of the H level and the PLLFAST signal 1026 of the H level.

When the PLL 1007 continues in a stable state of the frequency oscillation operation, the PFD 1016 in the PLL 1007 outputs the XINFAST signal 1015 of the H level and the PLLFAST signal 1026 of the high level. Further, the frequency lock signal generation circuit 101 outputs the lock signal of the H level (in the lock state). The stable detection timer 107 causes the underflow state when a desired time at which the counting down is completed has elapsed and then outputs the underflow signal 111 to the PLL stable detection register 108 because the frequency lock signal generation circuit 101 does not output the lock signal 110 indicating the initiation of the refresh operation to the stable detection timer 107. The PLL stable detection register 108 then inputs the underflow signal 111 and sets the value "1" therein.

A program to monitor the value stored in the stable detection register 108 is stored in the ROM 103 shown in FIG. 7. After the power of the microcomputer is switched ON, the program is executed to monitor the value stored in the PLL stable detection register 108 based on the XIN input signal supplied from an external device (not shown) as a system clock. Thereby, it is possible to efficiently detect the time that the PLL 1007 reaches the stable state that is changed by the operational conditions without waiting for a fixed time length to elapse, that has been set in advance, including an adequate time margin at which the reset state of the microcomputer 900 is released. On the contrary, the conventional microcomputer with a PLL must wait until the fixed time length is elapsed.

Thus, it is possible to switch the system clock of the microcomputer to the clock signal generated by and outputted from the PLL 1007 at the optimum timing, so that the microcomputer may initiate normal operation.

As described above, the microcomputer according to the first embodiment comprises a frequency lock signal generation circuit 101 which operates based on the XINFAST signal 1025 and the PLLFAST signal 1026 outputted from the PLL 1007, a stable detection timer 107, a PLL stable detection register 108, and a NAND circuit 109. Thus it is possible to efficiently detect the stable state of the PLL 1007 according to the operational conditions such as the change of the voltage of the power source to be used, the change of an environmental temperature, the condition of the input clock signal, and other various factors. Accordingly, it is possible to initiate the normal operation by switching the system clock of the microcomputer to the clock signal outputted from the PLL 1007 immediately after the PLL 1007 enters the stable state when the power of the microcomputer is switched ON and the microcomputer inputs the XIN input signal.

On the contrary, the release operation from the reset state in the conventional microcomputer with a PLL is delayed by a fixed time length including an adequate time margin. This fixed time length has been set in advance based on the control of an external device.

Second Embodiment

Figure 11:
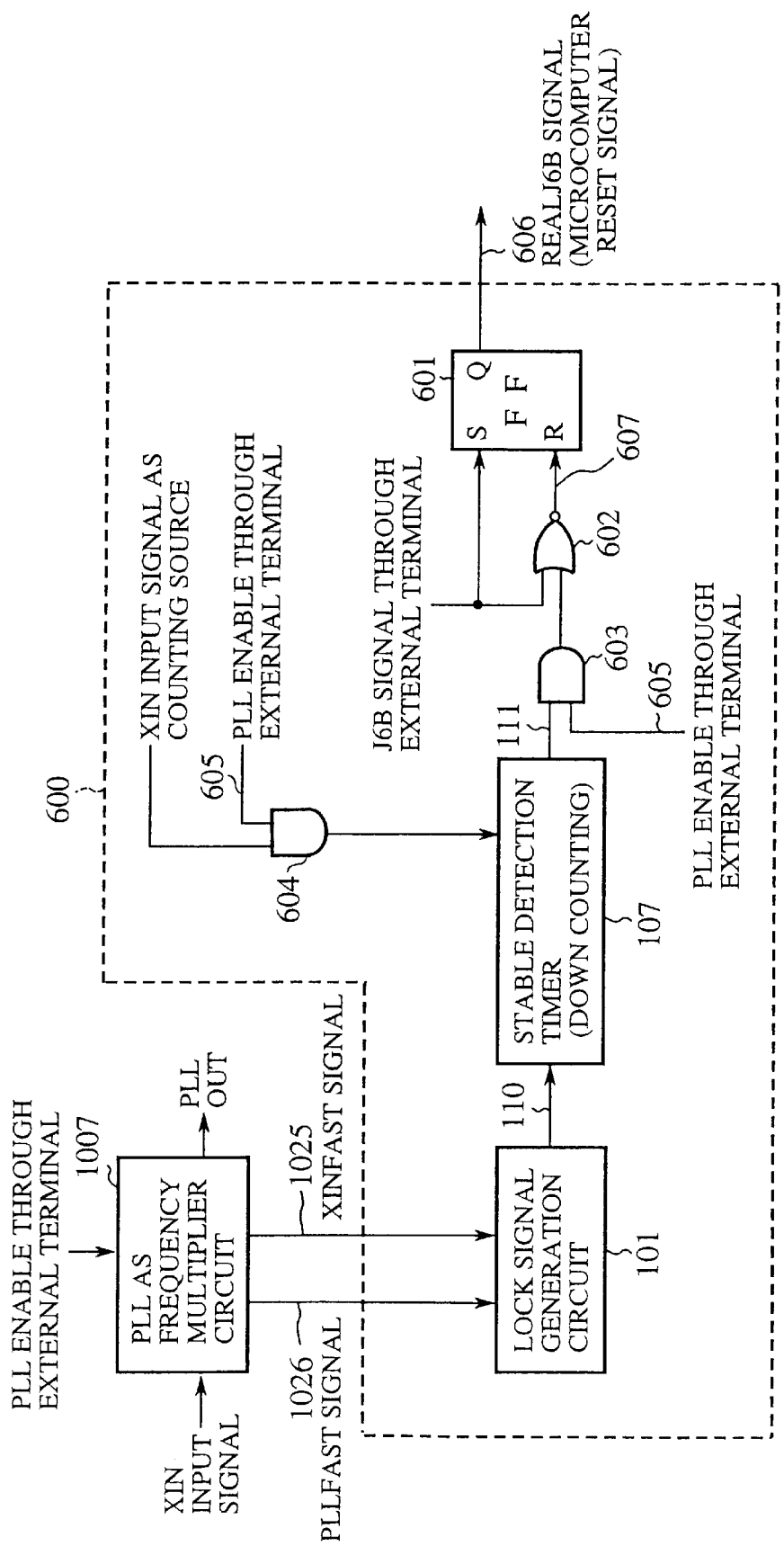
FIG. 11 is a block diagram showing a configuration of a PLL as a frequency multiplication circuit and a peripheral circuit incorporated in a microcomputer according to the second embodiment of the present invention.

FIG. 11 is a block diagram showing a configuration of the PLL 1007 as the frequency multiplication circuit and a peripheral circuit 600 incorporated in the microcomputer according to the second embodiment of the present invention. In FIG. 11, the reference number 601 designates a flip flop (FF) circuit, and 602 denotes a NOR circuit. The reference numbers 603 and 604 indicate AND circuits. The reference number 605 designates a PLLENBLE signal as a control signal supplied through an external terminal of the microcomputer in order to determine whether or not the PLL 1007 is used.

When the level of the PLLENBLE signal is the H level, the operation of the PLL 1007 is halted. The J6B signal to be supplied to the flip flop 601 is a control signal of the H level supplied through the external terminal (not shown) when the microcomputer is reset. Other components in the microcomputer of the second embodiment are the same as the components in the microcomputer as the first embodiment, therefore, the same reference numbers are used for the same components.

Next, a description will be given of the operation of the microcomputer with the PLL as the second embodiment.

Figure 12:
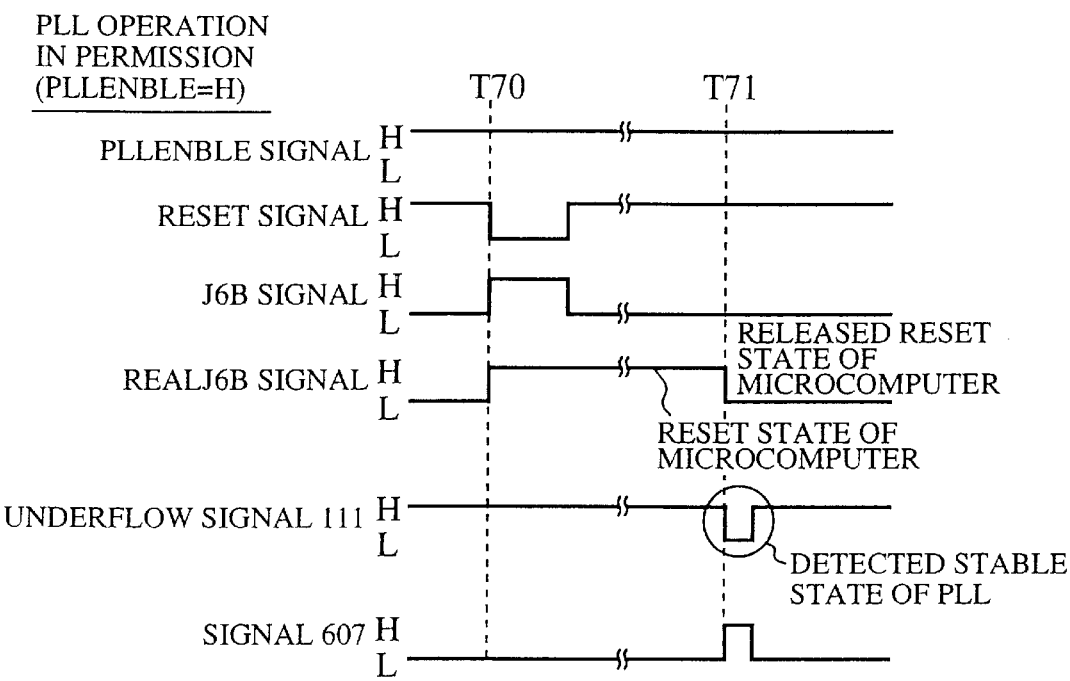
FIG. 12 is a timing chart showing the operation of the microcomputer with the PLL as the second embodiment.
Figure 13:
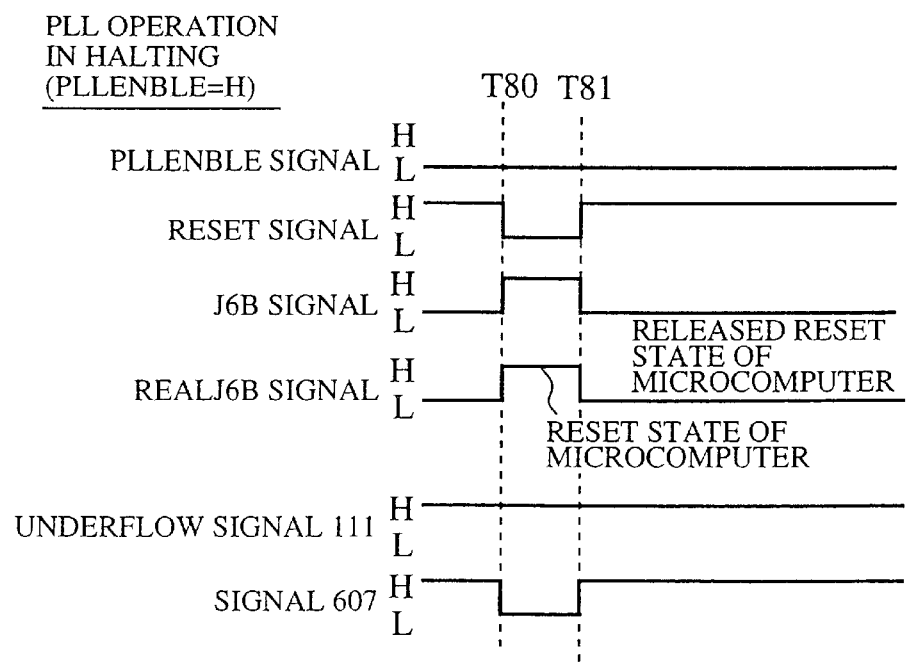
FIG. 13 is a timing chart showing the operation of the microcomputer with the PLL as the second embodiment.

FIG. 12 and FIG. 13 are timing charts showing the operation of the microcomputer with the PLL according to the second embodiment of the present invention.

At first, it will be explained that the PLL 1007 inputs the PLLENBLE signal 605 of the H level that permits the PLL 1007 to operate through an external terminal (not shown) of the microcomputer, as shown in the Timing chart of FIG. 12.

First, through the external terminal of the microcomputer, the PLL 1007 inputs the PLLENBLE signal of the H level as the PLL operation permit signal to permit the operation of the PLL 1007. After the power of the microcomputer enters ON and the PLL 1007 in the microcomputer inputs the XIN input signal, and then the flip flop circuit 601 inputs the J6B signal of the H level, the flip flop 601 enters a set state and the flip flop 601 outputs the REALJ6B signal 606 of the H level. (Timing T70). Thereby, the microcomputer enters the reset state.

In this situation, even if the microcomputer inputs the J6B signal of the L level as the reset release signal through the external terminal (not shown), the microcomputer maintains the reset state because the flip flop 601 does not enter the reset state and the REALJ6B signal 606 keeps the H level.

Next, like the same manner of the first embodiment, when the PLL 1007 outputs the underflow signal 111 of the L pulse, indicating that the PLL 1007 enters the stable state, to the flip flop 601, the flip flop 601 is reset, so that the flip flop 601 outputs the REALJ6B signal 606 of the L level (Timing T71). The reset state of the microcomputer is thereby released. (Timing T71).

On the contrary, it will be explained that the PLL 1007 inputs the PLLENBLE signal 605 of the L level that halts the operation of the PLL 1007 through the external terminal (not shown) of the microcomputer, as shown in the Timing chart of FIG. 13.

First, through the external terminal of the microcomputer, the PLL 1007 inputs the PLLENBLE signal of the L level indicating to halt the operation of the PLL 1007.

After the power of the microcomputer enters ON and the PLL 1007 in the microcomputer inputs the XIN input signal, and then the flip flop circuit 601 inputs the J6B signal of the H level, the flip flop 601 enters a set state and the flip flop 601 outputs the REALJ6B signal 606 of the H level. Thereby, the microcomputer enters the reset state (Timing T80).

After this, when the microcomputer inputs the reset release signal through the external terminal (not shown) and also inputs the J6B signal of the L level, the flip flop 601 enters the reset state and the REALJ6B signal 606 reaches the L level, so that the reset state of the microcomputer is thereby released (Timing T81).

As described above, according to the second embodiment, the reset state of the microcomputer is not released until the operation of the frequency oscillation in the PLL 1007 reaches the stable state when continuation of the operation of the PLL 1007 is permitted even if the reset state of the microcomputer is released before a predetermined time period is elapsed after the power of the microcomputer enters ON, the microcomputer inputs the XIN input signal, and the microcomputer enters the reset state. It is therefore possible for only the hardware elements in the microcomputer to release the reset state of the microcomputer. In addition, while the operation of the PLL is in the halt state, the reset state of the microcomputer is released by the reset release signal supplied from an external device of the microcomputer, as in the conventional example.

Third Embodiment

Figure 14:
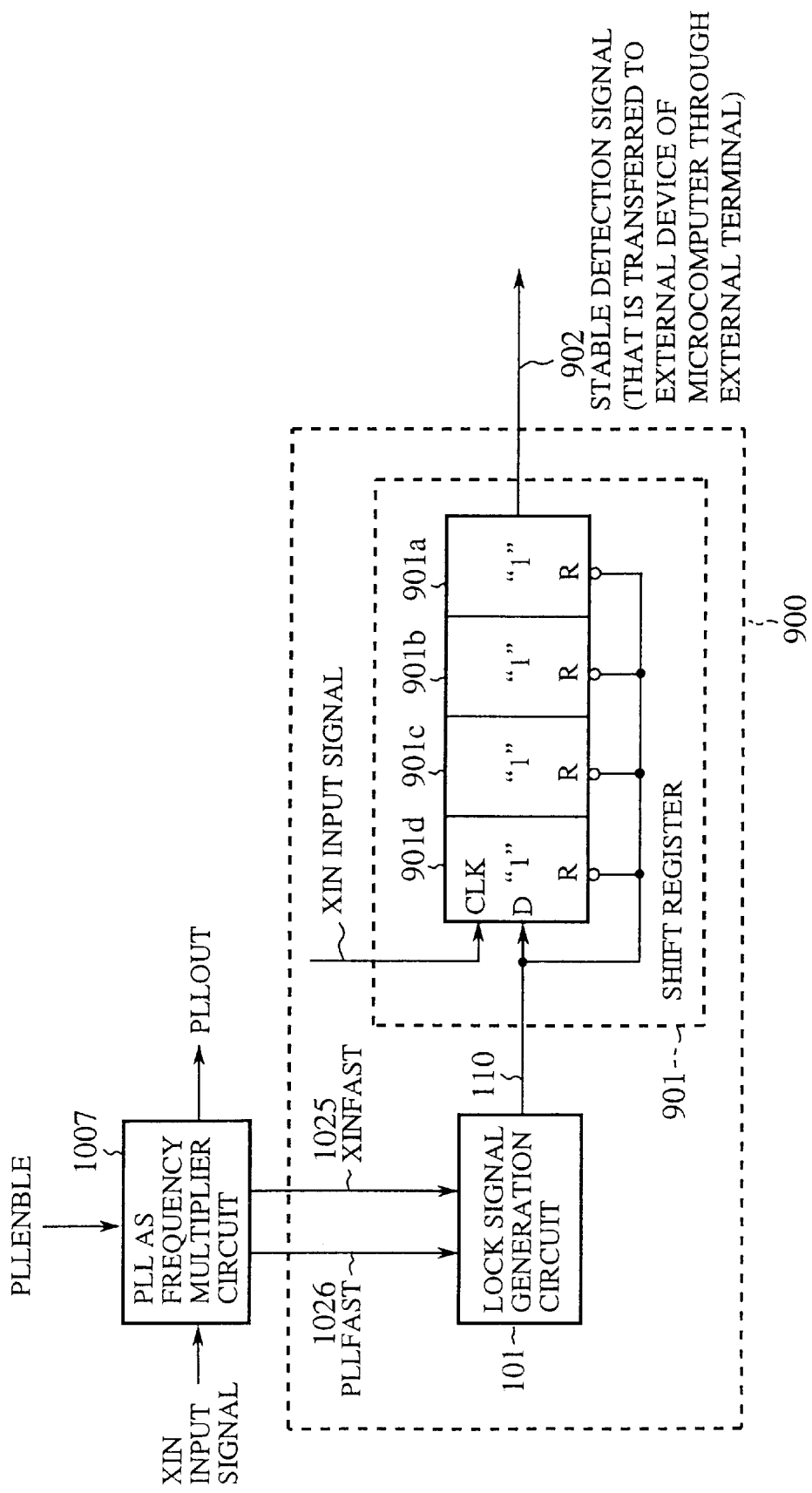
FIG. 14 is a block diagram showing a configuration of a PLL as a frequency multiplication circuit and peripheral circuits incorporated in a microcomputer according to the third embodiment of the present invention.

FIG. 14 is a block diagram showing a configuration of the PLL as the frequency multiplication circuit and a peripheral circuit 900 incorporated in the microcomputer according to the third embodiment of the present invention.

In FIG. 14, the reference number 901 designates a shift register comprising four registers 901a to 901d operable based on the XIN input signal as a clock signal. The reference number 902 denotes a stable detection signal to be supplied to an external device (not shown) of the microcomputer through an external terminal (not shown). Other components in the microcomputer of the third embodiment are the same as the components in the microcomputer as the first embodiment, therefore, the same reference numbers are used for the same components.

Next, a description will be given of the operation of the microcomputer with the PLL as the third embodiment.

Like the case that has been explained in the operation of the microprocessor according to the first embodiment, when the PLL 1007 outputs unstable oscillated frequency, as shown in FIG. 8 and FIG. 9, the frequency lock signal generation circuit 101 generates and outputs the lock signal 101 of the L pulse. All of the registers 901a to 901d forming the shift register 901 are thereby set to the reset state. Accordingly, the level of the stable detection signal 902 to be outputted to an external device (not shown) through the external terminal (not shown) becomes zero.

After the above operation, when the PLL 1007 enters the stable state, as shown in FIG. 10, the frequency lock signal generation circuit 101 outputs the level of the lock signal 110 of the H level. In this situation, the register 901d as the first stage in the shift register 901 inputs and stores the data "1" of the lock signal 110 at the first rising edge of the XIN input signal. When the frequency oscillation operation of the PLL 1007 is in the stable state continuously, the data "1" is shifted through the registers 901a to 901d, in order, from the lowest stage (901d) to the uppermost stage (901a) because the register 900 inputs the lock signal of the H level continuously. Unless the frequency lock signal generation circuit 101 outputs the lock signal 110 of the L level, the data "1" is reached to the register 901a as the uppermost stage, so that the uppermost register 901a in the shift register 901 outputs the stable detection signal 902 of the H level.

The stable detection signal 902 of the H level is transferred to the external device (not shown) through the external terminal of the microcomputer. By receiving the stable detection signal 902 of the H level, the external device can recognize that the frequency oscillation operation of the PLL 1007 enters the stable state. However, when the frequency lock signal generation circuit 101 outputs the lock signal 110 of the L level to the register 901, all of the registers 901a to 901d are reset, so that the registers 901a to 901d store the value "0" and the level of the stable detection signal 902 becomes the L level.

As described above, the microcomputer with the PLL according to the third embodiment comprises the peripheral circuit 900 connected to the PLL 1007. The peripheral circuit 900 has the shift register 901 made up of the registers 901a to 901d forming a plurality of stages that are reset by receiving the level of the lock signal outputted from the frequency lock signal generation circuit 101, and input the lock signal transferred from the frequency lock signal generation circuit 101 based on the rising edge or a falling edge of the XIN input signal. It is therefore possible to shift the lock signal 110 indicating the state of the frequency oscillation operation of the PLL 1007 through the registers 901a to 901d in the shift register 901, and the external device can receive the value stored in the register 901a as the uppermost stage in the shift register 901 through the external terminal (for example, the external terminal 1010 or 1009 shown in FIG. 7). It is thereby easily possible for the external device to detect the condition of the frequency oscillation operation of the PLL 1007.

As described above in detail, in the microcomputer with the frequency multiplication circuit according to the present invention, the frequency lock signal generation circuit inputs the XINFAST signal and the PLLFAST signal as the first control signal (indicating the phase difference between the rising edges of the XIN input signal and the clock signal) transferred from the PLL as the frequency multiplication circuit, and generates the second control signal based on the level of the first control signal, and outputs the second control signal to the stable detection timer. The stable detection timer controls the counting down operation based on the received second control signal. It is therefore possible to precisely detect the stable state of the frequency oscillation in the PLL even if operation conditions such as the voltage of the power source, the operational temperature, the frequency of the input signal, and so on are changed. Thereby, the present invention has the effect that it is possible to initiate the execution of the microcomputer efficiently.

In addition, in the microcomputer with the frequency multiplication circuit according to the present invention, the shift register made up of a plurality of registers forming a plurality of stages are further incorporated in the peripheral circuit connected to the PLL. The control signal indicating the state of the frequency oscillation of the PLL as the frequency multiplication circuit is transferred to the shift register according to the rising edge or the falling edge of the XIN input signal. This control signal is shifted from the lowest register to the uppermost register in the shift register in order. It is possible for the external device to read the value stored in the uppermost register through the external terminal of the microcomputer. Accordingly, the present invention has the effect that the external device can easily detect the state of the frequency oscillation of the PLL through the external terminal of the microcomputer.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A microcomputer with a frequency multiplication circuit comprising:

a frequency multiplication circuit for multiplying an input signal and outputting said input signal multiplied as a clock signal, and for generating and outputting a first control signal indicating a phase difference between said input signal and said clock signal;

control means for generating and outputting a second control signal of a first level when said first control signal indicating that said frequency oscillation operation of said frequency multiplication circuit is in an unstable state, and for generating and outputting said second control signal of a second level when said first control signal indicates that said frequency oscillation operation of said frequency multiplication circuit is in a stable state;

a stable detection timer for performing counting down operation by receiving said input signal and for refreshing said counting down operation when receiving said second control signal of said first level outputted from said control means; and a register for storing a value based on a third control signal generated by and transferred from said stable detection timer when the overflow happens in said stable detection timer, wherein said microcomputer initiates operation based on said value stored in said register.

2. A microcomputer with a frequency multiplication circuit according to claim 1, wherein said frequency multiplication circuit outputs a XINFAST signal of said first level as said first control signal indicating that a rising edge of said input signal is faster in phase than a rising edge of said clock signal, a PLLFAST signal of said first level as said first control signal indicating that a rising edge of said clock signal is faster in phase than a rising edge of said input signal, and further outputs said XINFAST signal of said second level and said PLLFAST signal of said second level as said first control signal when said frequency oscillation operation of said frequency multiplication circuit is in the stable state, and said control means comprises a delay circuit for inputting said XINFAST signal and said PLLFAST signal outputted from said frequency multiplication circuit, for delaying each of said XINFAST signal and said PLLFAST signal by a predetermined time length, a first NOR circuit for performing a NOR arithmetic operation between said XINFAST signal and delayed XINFAST signal from said delay circuit, a second NOR circuit for performing a NOR arithmetic operation between said PLLFAST signal and delayed PLLFAST signal from said delay circuit, and a third NOR circuit for performing a NOR arithmetic operation between outputs from said first NOR circuit and said second NOR circuit.

3. A microcomputer with a frequency multiplication circuit according to claim 1, further comprises a shift registers having a plurality of registers in a plurality of stages, wherein said register in the lowest stage stores a first value when receiving said second control signal of said second level outputted from said control means, and then, said first value is shifted to said plurality of registers in order when said shift register continuously receives said second control signal of said second level from said control means, and wherein a second value is set to all of said plurality of registers in said shift register when said shift register receives said second control signal of said first level outputted from said control means, and wherein an external device recognizes the operation state of said frequency multiplication circuit based on the value stored in said register as the uppermost stage in said shift register.

4. A microcomputer with a frequency multiplication circuit according to claim 1, said first level is a Low level and said second level is a High level.

5. A microcomputer with a frequency multiplication circuit according to claim 2, said first level is a Low level and said second level is a High level.

6. A microcomputer with a frequency multiplication circuit according to claim 3, said first level is a Low level and said second level is a High level.

* * * * *